United States Patent
Sun et al.

(10) Patent No.: US 10,127,964 B2
(45) Date of Patent: Nov. 13, 2018

(54) CIRCUITRY FOR FERROELECTRIC FET-BASED DYNAMIC RANDOM ACCESS MEMORY AND NON-VOLATILE MEMORY

(71) Applicant: Yale University, New Haven, CT (US)

(72) Inventors: Xiao Sun, New Haven, CT (US); Tso-Ping Ma, Branford, CT (US)

(73) Assignee: Yale University, New Haven, CT (US)

(*) Notice: Subject to any disclaimer, the term of this patent is extended or adjusted under 35 U.S.C. 154(b) by 0 days.

(21) Appl. No.: 15/323,197

(22) PCT Filed: Jul. 2, 2015

(86) PCT No.: PCT/US2015/039109
§ 371 (c)(1),
(2) Date: Dec. 30, 2016

(87) PCT Pub. No.: WO2016/004388
PCT Pub. Date: Jan. 7, 2016

(65) Prior Publication Data
US 2017/0140807 A1    May 18, 2017

Related U.S. Application Data

(60) Provisional application No. 62/020,480, filed on Jul. 3, 2014.

(51) Int. Cl.
*G11C 11/22*     (2006.01)
*G11C 29/52*     (2006.01)
*G11C 11/56*     (2006.01)

(52) U.S. Cl.
CPC .......... *G11C 11/2275* (2013.01); *G11C 29/52* (2013.01); *G11C 11/223* (2013.01); *G11C 11/5657* (2013.01); *G11C 2211/5648* (2013.01)

(58) Field of Classification Search
CPC ................ G11C 11/2275; G11C 29/52; G11C 2211/5648; G11C 2211/562; G11C 11/5657; G11C 11/223
USPC ........................................................ 365/145
See application file for complete search history.

(56) References Cited

U.S. PATENT DOCUMENTS

| | | |
|---|---|---|
| 5,198,994 A | 3/1993 | Natori |
| 5,912,837 A | 6/1999 | Lakhani |
| 5,963,473 A | 10/1999 | Norman |
| 6,067,244 A | 5/2000 | Ma et al. |
| 7,110,279 B2* | 9/2006 | Miyamoto ............. G11C 11/22 365/145 |

(Continued)

OTHER PUBLICATIONS

Hamming, Error Detecting and Error Correcting Codes, Bell Systems Technical Journal, vol. 29, No. 2, pp. 1-14; 1950.

(Continued)

*Primary Examiner* — Richard Elms
*Assistant Examiner* — Xiaochun L Chen
(74) *Attorney, Agent, or Firm* — McCarter & English, LLP (57) ABSTRACT

Exemplary embodiments of the present disclosure are directed to circuitry for effective operation of Ferroelectric-gated FET (FeFET) memories. Exemplary embodiment of the present disclosure includes circuits and/or circuit blocks to facilitate memory refresh, error checking and correcting (ECC), reading and sensing memory cells, program and erase operations, and other control and periphery operations for FeFET memory cell arrays.

15 Claims, 8 Drawing Sheets

(56) References Cited

U.S. PATENT DOCUMENTS

| | | | |
|---|---|---|---|
| 7,408,824 B2 | 8/2008 | Hoya et al. | |
| 8,164,941 B2 | 4/2012 | Kang et al. | |
| 8,179,710 B2* | 5/2012 | Minami | G11C 11/22 365/145 |
| 8,255,762 B2* | 8/2012 | Nagadomi | G06F 11/1068 714/704 |
| 2005/0057958 A1* | 3/2005 | Miyamoto | G11C 11/22 365/145 |
| 2005/0248979 A1 | 11/2005 | Karlsson et al. | |
| 2010/0110753 A1 | 5/2010 | Slesazeck et al. | |
| 2011/0182102 A1* | 7/2011 | Minami | G11C 11/22 365/145 |
| 2012/0060066 A1* | 3/2012 | Nagadomi | G06F 11/1068 714/704 |

OTHER PUBLICATIONS

Keeth et al., DRAM Circuit Design, IEEE Press Series on Microelectronic Systems, pp. 1-213, IEEE Press, Piscataway, NJ 08855-1331, 1999.

Wang et al, Operational Method of a Ferroelectric (FE)-NAND Flash Memory Array, Semicond. Sci. Tech., vol. 24, No. 10, 2009.

Müller et al, Ferroelectric $Zr_{0.5}Hf_{0.5}O_2$ Thin Films for nonvolatile memory applications, Appl. Phys. Lett.,vol. 99, Issue 11, 2011.

Mueller et al., Reliability Characteristics of Ferroelectric Si:$HfO_2$ Thin Films for Memory Applications, IEEE Trans. Elec. Dev., vol. 13, Iss. 1, pp. 93-97, IEEE Press, Piscataway, NJ 08855-1331, 2013.

PCT International Search Report and Written Opinion for PCT/US2015/039109 dated Oct. 23, 2015.

U.S. Appl. No. 62/020,480, filed Jul. 3, 2014.

PCT/US2015/039109, Jul. 2, 2015, WO 2016/004388.

\* cited by examiner

CIRCUITRY FOR FERROELECTRIC FET-BASED DYNAMIC RANDOM ACCESS MEMORY AND NON-VOLATILE MEMORY

CROSS REFERENCE TO RELATED APPLICATIONS

This application claims priority to U.S. Provisional Application No. 62/020,480, filed on Jul. 3, 2014, the disclosure of which is incorporated herein by reference in its entirety.

TECHNICAL FIELD

Exemplary embodiments of the present disclosure relate to circuitry for effective and efficient operation of Ferroelectric-gated Field Effect Transistor (FeFET) memory, and more particularly to circuits and/or circuit blocks to facilitate memory refresh, error checking and correcting (ECC), reading and sensing memory cells, program and erase operations, and other control and periphery operations for FeFET memory cell arrays.

BACKGROUND

Random access memory (RAM) falls generally into two categories, namely, static and dynamic. Both types of RAM are made up of an array of addressable storage cells, each one storing a bit of information (or multi-bit information). In static RAM (SRAM), the storage unit within the cell is typically a bi-stable flip-flop and the state of the flip-flop indicates whether the cell stores a zero or a one. In dynamic RAM (DRAM) the storage unit is typically an IC capacitor and the charge on the capacitor indicates whether the stored value is either a zero or a one. In the case of DRAM's, however, capacitors gradually lose charge and thus it is necessary to "refresh" the stored data as often as every few milliseconds. The refreshing operation is performed by first reading the value in the cell and then writing it back. This is done for every cell in the array and it typically requires complicated control circuitry.

The earliest DRAM cell, introduced in the early 1970's, contained four transistors. Later, 3-transistor DRAM cells were introduced, which made the cell size smaller and memory density higher. Shortly after, the 1-transistor/1-capacitor cell was introduced, which wiped out all its competitors because of its simplicity as well as its small cell size, and has remained an industry standard. Over the years, through the 4 Kb, 16 Kb, 64 Kb, and 256 Kb SDRAM generation, the cell size was reduced by shrinking both the transistor and the capacitor dimensions. Starting from the 1 Mb SDRAM generation in the mid 1980's, however, the capacitor has been forced to assume a more and more complicated 3-dimensional structure to store enough charges for a given cell size. It is safe to say that the most costly part of the SDRAM cell, including the R&D efforts and the production cost, is, and will continue to be into the foreseeable future, the capacitor. And it may very well discourage continued scaling somewhere down the line, unless a new DRAM cell design is adopted which can live without the capacitor.

Due to its fast switching speed and long retention, FeFET-based memory may be used to perform the functions of DRAM, e.g., as described in U.S. Pat. No. 6,067,244 and/or Non-volatile memory (NVM), e.g., as described in U.S. Pat. No. 5,198,994, each of which are incorporated by reference herein in their entirety.

FeFET-based DRAM (FeDRAM) has several advantages over the conventional DRAM: (1) capacitor-less structure (only one transistor is needed for the memory cell), (2) long retention that enables low refresh frequency, (3) non-destructive "read operation", (4) small cell size and better scalability, and (5) much more suitable for embedded technology. Use FeDRAM to replace the conventional DRAM has be proposed (see, e.g., U.S. Pat. No. 6,067,244) because the advantages of FeFET-based memory allows FeFET-based memory has faster Program/Erase speed and better endurance than conventional flash memory, making it potentially useful for future storage-class memories. The recent discovery of $HfO_2$-based ferroelectrics (J Müller et al, Appl. Phys. Lett., 99, 112901 (2011)) have overcome the limitations of the state-of-the-art ferroelectric materials, such as $Pb(Zr,Ti)O_3$ (Lead Zirconate Titanate) and $SrBi_2Ta_2O_9$ (Strontium Bismuth Tantalate), making the FeFET-based 1-transistor (1-T) memory technology more suitable for commercial application.

Special circuits and operation schemes are needed for the operation of FeFET-based memory chips, as they are distinctly different from the circuits designed for other memory technologies.

SUMMARY

Exemplary embodiments of the present disclosure are directed to circuitry for effective operation of Ferroelectric-gated FET (FeFET) memories. Exemplary embodiment of the present disclosure includes circuits and/or circuit blocks to facilitate memory refresh, error checking and correcting (ECC), reading and sensing memory cells, program and erase operations, and other control and periphery operations for FeFET memory cell arrays.

In accordance with embodiments of the present disclosure, a memory circuit is disclosed. The FeFET-based memory circuit includes FeFET-based memory cells, wordlines, bitlines, and sourcelines. The FeFET-based data memory cells are arranged in an array having rows and columns and are capable of being polarized to set memory values of the FeFET-based memory cells to a logic one or a logic zero. Each of the wordlines operatively coupled to one of the rows of FeFET-based data memory cells. Each of the bitlines operatively coupled to the columns of FeFET-based data memory cells. Each of the sourcelines operatively coupled to the columns of FeFET-based data memory cells. Control signals on the wordlines, bitlines, and sourcelines of unselected FeFET-based memory cells adjacent to a selected one of the FeFET-based memory cells are applied to control disturbances to polarizations of the unselected FeFET-based memory cells by applying a first control voltage to the wordlines of the unselected FeFET-based memory cells during a portion of a program or erase pulse and applying a second control voltage to the bitlines and the source lines of the unselected FeFET-based memory cells during another portion of the program or erase pulse.

In accordance with embodiments of the present disclosure, a method of controlling a degree to which polarization of an unselected FeFET-based memory cell in a memory array is disturbed by an operation performed with respect to a selected memory cell is disclosed. The method includes applying a first control voltage to a wordline of the unselected FeFET-based memory cell during a portion of a program or erase pulse; and applying a second control voltage to the bitline and the source line of the unselected FeFET-based memory cell during another portion of the program or erase pulse.

In accordance with exemplary embodiments, a memory circuit is disclosed that includes an active memory array, a reference memory array, and refresh circuitry. The active array including active FeFET-based memory cells, each of the FeFET-based memory cells begin formed with a Ferroelectric Field Effect Transistor. The reference array including reference FeFET-based memory cells, each of the FeFET-based memory cells begin formed with a Ferroelectric Field Effect Transistor. The refresh circuitry is operatively coupled to the active FeFET-based memory cells and the reference FeFET-based memory cells. The refresh circuitry is configured to refresh one or more of the active FeFET-based memory cells in response to satisfaction of a refresh threshold associated with one or more of the reference FeFET-based memory cells.

In accordance with embodiments of the present disclosure, a method of refreshing a FeFET-based memory circuit having an active array of FeFET-based memory cells and a reference array of FeFET-based memory cells corresponding to the active array is disclosed. The method includes monitoring a response of the FeFET-based memory cells in the reference array corresponding to a selected one or more of the FeFET-based memory cells in the active array to determine an effect of selection of the at least one or more of the FeFET-based memory cells in the active array on the polarization of the FeFET-based memory cells of the reference array; determining whether the effect to the polarization of the FeFET-based memory cells of the reference array satisfies a refresh threshold; and refreshing at least a subset of the FeFET-based memory cells in the active array in response to determining that the refresh threshold is satisfied.

In accordance with embodiments of the present disclosure, an integrated circuit is disclosed that includes a Ferroelectric-gated Field Effect Transistor (FeFET)-based memory array and refresh circuitry. The memory array includes data memory cells. Each of the data memory cells are formed by a Ferroelectric Field Effect Transistor. The refresh circuitry is operatively coupled to the data memory cells, and is configured to refresh the data memory cells in response to satisfaction of a refresh threshold.

In accordance with embodiments of the present disclosure, a Ferroelectric Dynamic Random Access Memory (FeDRAM) is disclosed. The FeDRAM includes a memory array and an error checking and correcting (ECC) unit. The memory array includes data memory cells. Each of the data memory cells are formed by a Ferroelectric Field Effect Transistor. The error checking and correcting unit detects and corrects errors in data stored by the data memory cells.

In accordance with embodiments of the present disclosure, a Ferroelectric Field Effect Transistor (FeFET)—based memory circuit is disclosed. In the FeFET-based circuit, FeFET-based data memory cells arranged in an array having rows and columns. A wordline is provided for each of the rows of FeFET-based data memory cells, and a bitline and a sourceline are provided for each of the columns of FeFET-based data memory cells in the array. A pulse width of control signals on the wordline, bitline, and sourceline is specified to control a disturb experienced by unselected cells that are adjacent to selected cells.

In accordance with embodiments of the present disclosure, a method of refreshing a FeFET-based memory circuit is disclosed. The method includes determining a number of times at least one of a wordline, bitline, or sourceline of a FeFET-based memory array have been selected in response to a at least one of a program operation or an erase operation, determining whether the number satisfies a refresh threshold, and refreshing at least one data memory cell in the FeFET-based memory array in response to determining that the number satisfies the refresh threshold.

In accordance with embodiments of the present disclosure, a method of operating a FeDRAM circuit is disclosed. The method includes writing data to a memory array of the FeDRAM circuit, generating a parity code for the data in response to the writing of the data, storing the parity code in memory array, reading the data from the memory array of the FeDRAM circuit, retrieving the parity code from the memory array, and processing the data and the parity code to detect and correct errors in the data.

In accordance with embodiments of the present disclosure, a method of controlling a degree to which an unselected memory cell in a FeFET-based memory array are disturbed by an operation performed with respect to a selected memory cell is disclosed. The method includes applying a voltage (e.g., Vpp/4) to a bitline and a sourceline associated with the unselected cell during a first half of the operation and applying the voltage with an opposite polarity (e.g., −Vpp/4) to a wordline associated with the unselected cell during a second half of the programming pulse. The same strategy can also be applied for an erase operation with a reversed voltage polarity. For example, a voltage (e.g., −Vpp/4) can be applied on the bitlines and the sourcelines associated with unselected cells during a first half of the erasing pulse, and the voltage with an opposite polarity (e.g., Vpp/4) can be applied on the WL of all the unselected cells is applied to the during a second half of the erasing pulse.

In accordance with embodiments of the present disclosure, the refresh threshold can be adjustable over a lifespan of the data memory cells to accommodate for deterioration of the data memory cells. The refresh threshold can be adjusted according to a pre-determined schedule and/or the memory array includes reference memory cells, and the refresh threshold can be adjusted according to a use of reference FeFET cells.

The refresh circuitry can include a voltage sensor for each of a wordline, bitline, and/or sourceline of the memory array, and can be configured to output sensed voltages (or other voltage characters comprising polarity, amplitude level, etc.) of the wordline, bitline, and/or sourceline. A counter circuit can be operatively coupled to the output of each voltage sensor, and can be configured to monitor a number of times the wordline, bitline, and/or sourceline is selected. Refresh control circuitry can be operatively coupled to each counter circuit, and can be configured to determine whether the refresh threshold is satisfied based on the number of times the wordline, bitline, and/or sourceline is selected, and can be configured to refresh at least one of the data memory cells in the memory array in response to determining the number of times the wordline, bitline, and/or sourceline is selected satisfies the refresh threshold.

In some embodiments, the reference memory cells can each be formed by a Ferroelectric Field Effect Transistor, and the refresh circuitry can include a check unit that determines a state of the reference memory cells and a refresh control circuitry operatively coupled to the check unit to initiate a refresh of the data memory cells based on a state of the reference memory cells.

In accordance with embodiments of the present disclosure, the error checking and correcting unit is operatively coupled to the data memory cells. The error checking and correcting unit can be configured to generate a parity code associated with the data when the data is written to the data memory cells, and in response to a read request for data, the error checking and correcting unit can be configured to process the data and a parity code associated with the data to detect and correct errors in the data.

Any combination and/or permutation of embodiments is envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

Exemplary embodiments of the present disclosure will be understood from the following detailed description when read with the accompanying Figures. In the drawings, like reference numerals refer to like parts throughout the various views of the non-limiting and non-exhaustive embodiments of the present invention, and wherein.

DETAILED DESCRIPTION

Exemplary embodiments of the present disclosure are directed to circuitry for effective operation of Ferroelectric-gated FET (FeFET) memories. Exemplary embodiment of the present disclosure includes circuits and/or circuit blocks to facilitate memory refresh, error checking and correcting (ECC), reading and sensing memory cells, program and erase operations, and other control and periphery operations for FeFET memory cell arrays.

As used herein, the term "a" or "an" means "at least one" or "one or more."

Figure 1:
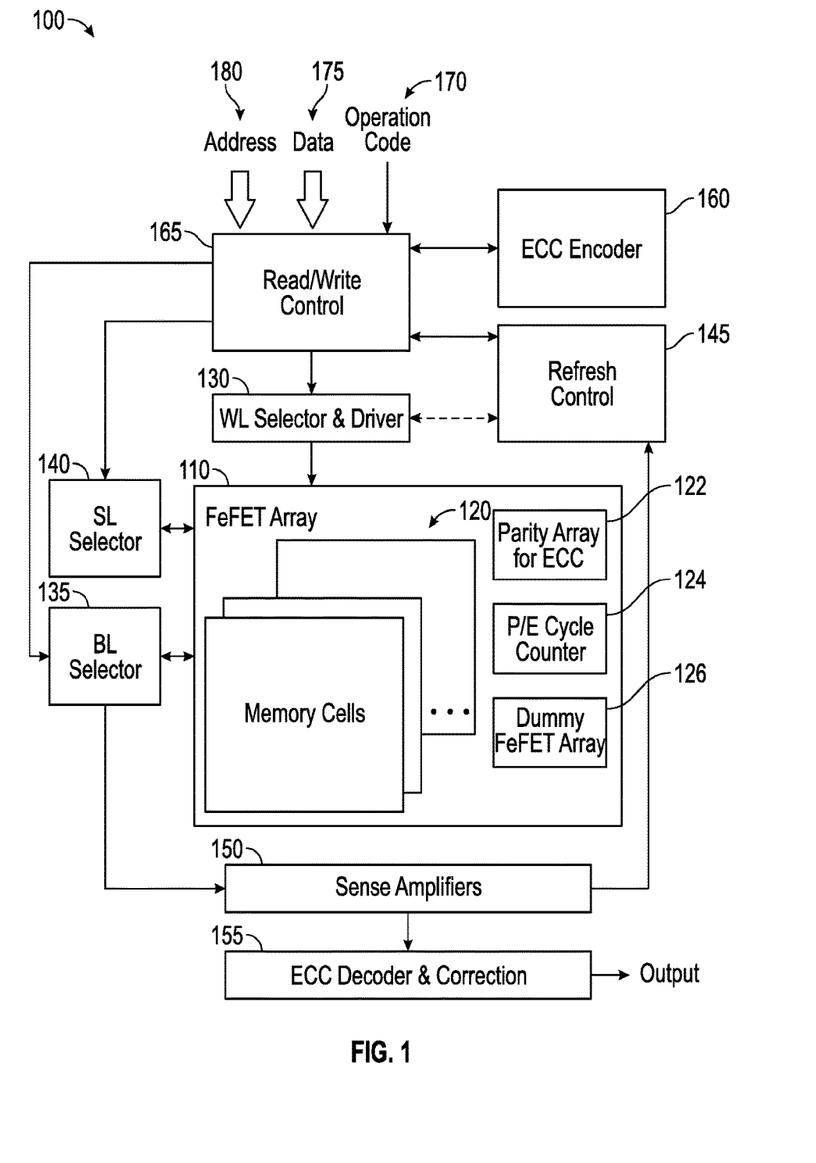
FIG. 1 is a block diagram of a Ferroelectric Field Effect Transistor (FeFET) memory circuit in accordance with exemplary embodiments of the present disclosure.

FIG. 1 is a block diagram of a non-volatile or RAM Ferroelectric Field Effect Transistor (FeFET) memory circuit 100 (e.g., an integrated circuit) in accordance with exemplary embodiments of the present disclosure. In some embodiments the memory circuit 100 can also include memory cells or arrays that are not FeFET-based such that the memory circuit is a hybrid circuit including FeFET-based memory cells or arrays and non-FeFET-based memory cells or arrays. The circuit 100 can include one or more Ferroelectric Field Effect Transistor (FeFET) memory arrays 110 (e.g., an active memory array), selector units (e.g., word line selector and driver 130, bit line selector 135, and source line selector 140), refresh circuitry including, e.g., at least refresh control circuitry 145, sense amplifiers 150, Error Checking and Correcting (ECC) units (e.g., ECC decoder and correction circuitry 155 and ECC encoder circuitry 160), and general control circuitry (e.g., read/write control circuitry 165). While an embodiment of the circuit 100 has been illustrated as including an instance of refresh control circuitry 145, ECC decoder and correction circuitry 155, and ECC encoder circuitry 160, those skilled in the art will recognize that exemplary embodiments of the present disclosure can include multiple instances of refresh control circuitry 145, ECC decoder and correction circuitry 155, and ECC encoder circuitry 160, and that an operation and function of multiple instances of the circuitry can be overlapping and/or independent.

The architecture of FeFET-based memory arrays 110 can vary based on the purpose of the memory and can be configured, for example, as non-volatile memory or RAM. For embodiments in which the FeFET-based memory arrays 110 are implemented to operate as DRAM-like memory, such as the FeDRAM, the memory arrays 110 include FeFET-based memory cells 120 connected in an "AND" logic array configuration, as opposed to flash memory architectures that utilize "NAND" or "NOR" logic array. In addition to data storage provided by the memory cells 120 of an array 110, some, all, or none of the FeFET-based arrays 110 and/or memory cells 120 can be utilized for purposes other than data storage. For example, in exemplary embodiments, one or more of the FeFET arrays 110 can include a parity storage area 122 for ECC, storage area 124 for counters, reference FeFET memory cell arrays 126 (e.g., a reference memory arrays formed of reference FeFET-based memory cells), and/or can include storage for any other suitable purpose, such as for hashing and the like. The ECC units (e.g., ECC decoder and correction circuitry 155 and ECC encoder circuitry 160) can be included in the circuit 100 to enhance reliability of the circuit 100. For FeDRAM, ECC, circuitry based on single error correction and double error detection (SEC/DED) can be utilized due to low area and power cost associated with these correction and detection schemes. In some embodiments the FeFETs of the FeFET-based memory arrays can be formed using $HfO_2$-based ferroelectrics.

In an exemplary write operation, the read/write control circuitry 165 can receive an operation identifier 170 (e.g., a write command), data 175 to be written to the memory array 110, and an address 180 associated with the data to be written to the memory arrays 110. In some embodiments, the read/write control circuitry 165 can receive a logical address and can convert the logical address to a physical address corresponding to one or more memory cells 120 in the array 110. In some embodiments, the address 180 received by the read/write control circuitry 165 can be the physical address to which the data will be stored (e.g., a logical address can be converted to a physical address prior to receipt by the read/write control circuitry 165).

In response to receipt of the write command, the data 175 can be output from the read/write control circuitry 165 to the ECC encoder circuitry 160. The ECC encoder circuitry 160 can generate parity code for the data 175 and can associate the parity code with the address 180 at which the data is to be stored in the memory array. Subsequently, the parity codes can be stored in the assigned area in FeFET-based memory arrays (e.g., the parity storage area 122 for ECC) and the data 175 can be stored in the memory cells of the array 110. To store the data at the requested address 180, the read/write control circuitry 165 can control the word line selector and driver 130 to select one or more rows of memory cells 120 within the memory array 110, and can control the bit line selector 135 and the source selector 140 to select one or more columns of memory cells within the memory array 100. The selected row(s) and column(s) of the memory array 110 can correspond to the physical address at which the data is stored. In some embodiments, before, after, or during the write operation, a counter value can be incremented and stored in the storage area 124 for the counters. This counter value can be used by the refresh control circuitry to determine when the memory cells 120 of the array 110 are refreshed (e.g., read and rewritten with the data that was read). In some embodiments, the voltages of memory cells in the dummy array 126 can be affected by the write operation to change (e.g., disturb) the voltage associated the memory cells of the reference/dummy array 126, and the voltage of the memory cells in the dummy array 126 can be used by the refresh control circuitry 145 to determine when to refresh the data in the memory cells 120 of the array 110.

In an exemplary read operation, the read/write control circuitry 165 can receive the operation identifier 170 (e.g., a read command) and an address 180 associated with the data to be read from the memory arrays 110. In exemplary embodiments, the read/write control circuitry 165 can receive a logical address and can convert the logical address to a physical address corresponding to one or more memory cells 120 in the array 110. In some embodiments, the address 180 received by the read/write control circuitry 165 can be the physical address to which the data will be stored (e.g., a logical address can be converted to a physical address prior to receipt by the read/write control circuitry 165).

In response to receipt of the read command, the data stored at the requested address 180 can be selected by the read/write control circuitry 165 by controlling the word line selector and driver 130 to select one or more rows of memory cells 120 within the memory array 110, and controlling the bit line selector 135 and the source selector 140 to select one or more columns of memory cells 120 within the memory array 110 at which the data is stored. During the read operation, a parity code corresponding to the requested data can be selected from the parity storage area 122. The data at the selected row(s) and column(s) can be received by the sense amplifiers 150, which can output the data and the parity code to the ECC decoder and correction circuitry 155. The ECC detection and correction circuitry 150 can process the data and the parity code to detect and correct errors in the data and the data read form the memory cells 120 of the array 110 can be output by the circuit 100. In some embodiments, before, after, or during the read operation, the counter value can be incremented and stored in the storage area 124 for the counters, which can be used by the refresh control circuitry to determine when the memory cells 120 of the array 110 are refreshed (e.g., read and rewritten with the data that was read). In some embodiments, the voltages of memory cells in the reference/dummy array 126 can be affected by the read operation to change (e.g., disturb) the voltage associated the memory cells of the reference/dummy array 126, and the voltage of the memory cells in the reference/dummy array 126 can be used by the refresh control circuitry 145 to determine when to refresh the data in the memory cells 120 of the active array 110.

Figure 2:
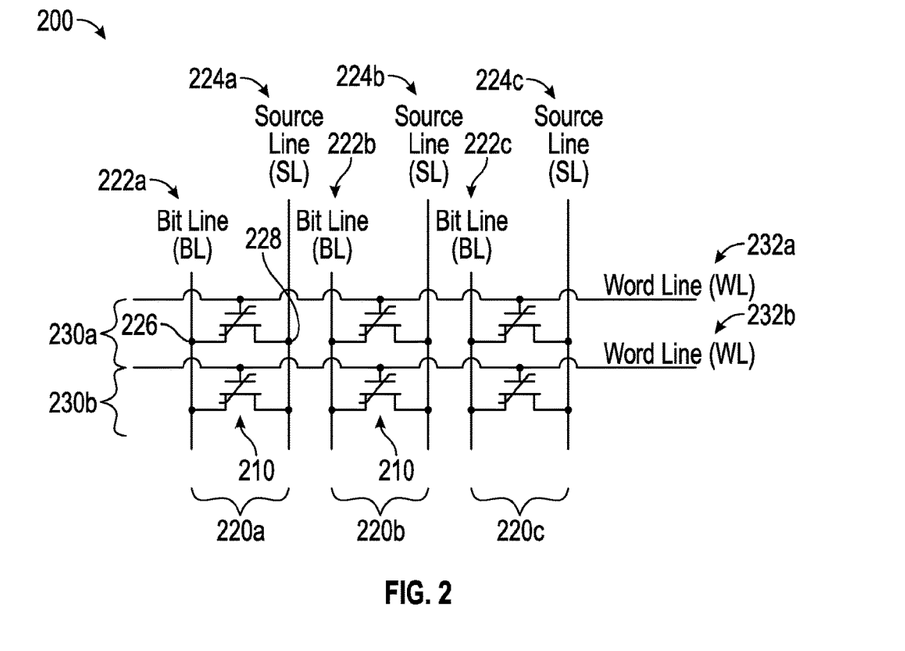
FIG. 2 is a diagram of a FeFET-based memory cell array in accordance with exemplary embodiments of the present disclosure.

FIG. 2 is a diagram of a portion of an AND-style FeFET-based memory cell array 200 (e.g., formed using $HfO_2$-based ferroelectrics) in accordance with exemplary embodiments. Each FeFET-based cell can include a Ferro-electric field-effect transistor having a gate dielectric formed of a ferroelectric material (e.g., a ferroelectric film). The FeFET serves as both the data storage element and its own readout device. Data storage is accomplished by inducing a polarization in a ferroelectric film that modulates the conductivity of the FeFETs conduction channel, which can be sensed when reading stored data from the FeFET. For example, if the ferroelectric gate has an initial polarization that prevents formation of an inversion layer in the silicon conduction channel; thereby preventing current from flowing between the source and drain, FeFET-based memory cell stores a logic zero. If a positive gate voltage pulse of sufficient amplitude and duration is applied, the polarization of the ferroelectric film that forms the gate is reversed and induces an inversion layer that allows significant drain current to flow defining a logic one. In exemplary embodiments, the polarization of unselected cells can be disturbed when adjacent cells are selected for programming and/or erasing.

In AND-style FeFET-based memory arrays, the FeFET-based cells 210 in the same column share the same source and drain contact lines: the bitline (BL) and the sourceline (SL), respectively. The FeFET cells 210 in the same row share the same gate contact lines, e.g., wordline (WL). FIG. 2 shows a portion of the array 200 having three columns 220a, 220b, and 220c (collectively columns 220) of cells 210 and two rows 230a and 230b (collectively rows 230) of cells 210. Each of the columns 220a, 220b, and 220c include a bitline 222a, 222b, 222c (collectively bitlines 222), respectively, that is operatively coupled to a drain of the FeFET cells 210 in the corresponding columns. Each of the columns 220a, 220b, and 220c also include a sourceline 224a, 224b, 224c (collectively sourcelines 224), respectively, that is operatively coupled to a source of the FeFET cells 210 in the corresponding columns. Each of the rows 230a and 230b include a wordline 232a and 232b (collectively wordlines 232), respectively, that is operatively coupled to the gates of the cells 210 in the corresponding row. While the array 200 illustrated in FIG. 2 is a non-limiting example of an AND-style FeFET-based memory cell array, those skilled in the art will recognize that memory cell arrays of exemplary embodiments of the present disclosure can be implemented using any suitable logical functions, such as, for example, NAND-style FeFET-based arrays, NOR-style FeFET arrays, and the like.

Figure 3:
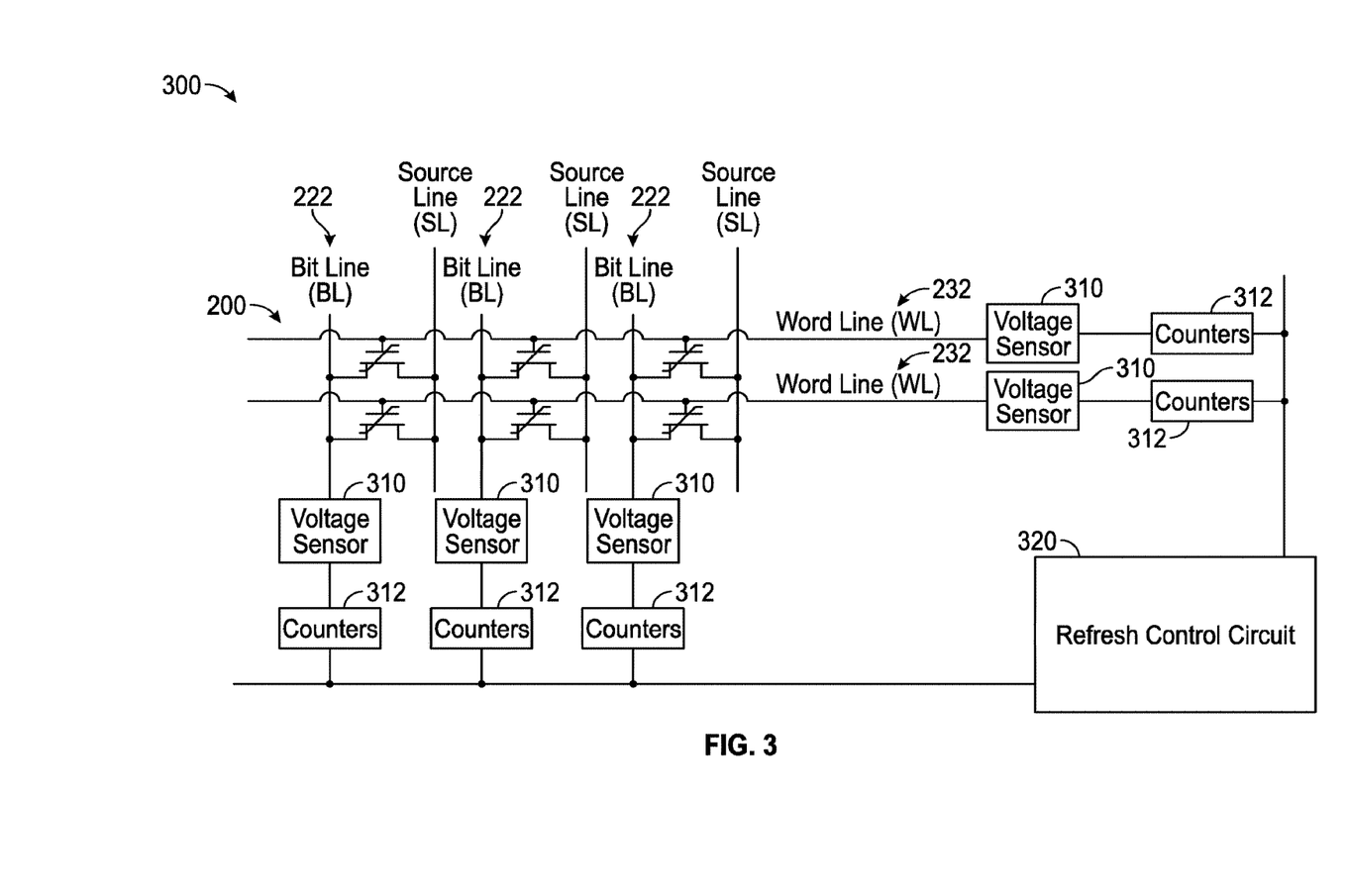
FIG. 3 is a diagram showing memory cell refresh circuitry for a FeFET-based memory cell array in accordance with exemplary embodiments of the present disclosure.

FIG. 3 is a diagram showing memory cell refresh circuitry 300 for an embodiment of a FeFET-based memory cell array 200 in accordance with exemplary embodiments. The refresh circuitry is designed to take into account the unique characteristics of FeFET-based memory cells, including the state retention, the effect of disturbs (writes/reads) on the polarization of the FeFET-based memory cells, the degradation over incremental program/erase cycles, and the like.

In present embodiment, as one example, the refresh circuitry 300 can be implemented for FeDRAM. The refresh circuitry 300 can be used for other FeFET-based memory technologies with slight modifications. While conventional DRAM requires very high refresh frequency and mandatory rewrite after the destructive "read" operation, FeFET-based memory cells have several-order longer retention time than capacitor-based DRAM cells. Also, FeDRAM does not lose data after the read operation (i.e. read operations do not generally affect a polarization of the FeFETs), and hence does not need rewrite after read. In this disclosure, the refresh of the FeDRAM memory could be based on several different methods, some of which may build on the conventional schemes such as RAS refresh, CBR refresh, hidden refresh, and/or some new schemes as described herein.

In addition to disturbance of the polarization of FeFET-based memory cells, or alternatively, exemplary embodiments of the refresh circuitry can be designed to accommodate the retention characteristics of the FeFET-based memory cells, which is much longer than the conventional DRAM cell, but could be shorter than the floating-gate transistor-based flash memory. For FeDRAM, the refresh rate of FeDRAM can be substantially lower than that in DRAM, even considering program/erase (P/E) induced disturb events. In exemplary embodiments, the refresh rate is adjusted according to the working state of the memory through refresh control circuitry 320. The working state of the memory can be obtained from the Read/Write control circuitry, which provides information about P/E rates of various regions of cells, circuit temperature, power "on" or "off", and the like.

The retention of FeFET-based memory cells depends on several factors, including P/E voltages, P/E pulse-widths and P/E cycles. For low P/E voltages and/or shorter P/E durations, the FeFET-based memory cell is expected to have shorter retention due to partial polarization. Also, the retention time reduces as the memory cells are programmed/erased for more times. To accommodate these variables, in exemplary embodiments, the refresh threshold can be dynamically adjusted according to the P/E stimulation over the lifespan of the FeFET-based memory, during which the endurance keeps deteriorating. In some embodiments, the dynamic refresh scheme can be adjusted based on a pre-determined schedule (e.g., after a predetermined number of program/erase cycles increase the refresh rate by decreases the refresh threshold) or can based on a use of reference FeFET memory cells (e.g., determine when to refresh the data memory cells based on a state of the reference memory cells).

The refresh circuitry 300 is designed primarily to minimize/reduce an effect of program/erase (P/E) disturb on the polarization of the FeFET-based memory cells. P/E disturb is a significant problem for FeFET-based memory arrays, in which unselected memory cells near a selected cell may have their polarization states altered due to the shared contact lines with the selected cells (e.g., bitlines, source lines, wordlines). Thus, the voltage at unselected cells may drift higher or lower in response to P/E cycles, which can effect the polarization of the ferroelectric gate material in the unselected cells. To recover the influenced unselected cells after a number of P/E operations, a refresh operation can be conducted by the refresh circuitry.

In exemplary embodiments, the refresh circuitry 300 includes voltage sensors 310 counters/registers 312, and one or more instances of refresh control circuitry 320. The sensors 310 can be used to measure a voltage on the bitlines, sourcelines, and wordlines of the array 200. The counters/registers 312 can be used to record the disturb history of each row, column, array etc., based on a voltage sensed by the voltage sensors 310. For example, each time a wordline associated with a particular row is sensed via the voltage sensor 310, the corresponding counter/register 312 can increment a count value stored in a register. The refresh control circuitry 320 can monitor the count values associated with the counter/registers 312, and when the refresh threshold of disturb is reached (a specified number count value corresponding to a number of times the bitlines, sourcelines, and/or wordlines are selected), the refresh control circuitry 320 can be configured to refresh the corresponding FeFET-based memory cells 210 associated with the bitlines, sourcelines, and/or wordlines (the entire array) for which the threshold is reached. Refreshing the cells 210 can be achieved by reading and rewriting the values stored by the cells 210. In exemplary embodiments, the threshold can be a number of times the bitlines, sourcelines, and/or wordlines are selected, and/or can be a cumulative number of times that the bitlines, sourcelines, and wordlines are selected for a row, column, and/or array.

In some embodiments, algorithms more complex than the simple counting can be applied to determine when a refresh threshold is satisfied to trigger the refresh operations. For example, in some embodiments, disturb events can be divided into those induced by programming and those induced by erasing neighboring (selected) cells, as well as those induced by the shared WL and those induced by the shared BL/SL. In some embodiments, the net effects of various disturb events can be evaluated to input to the refresh control circuitry.

Figure 4:
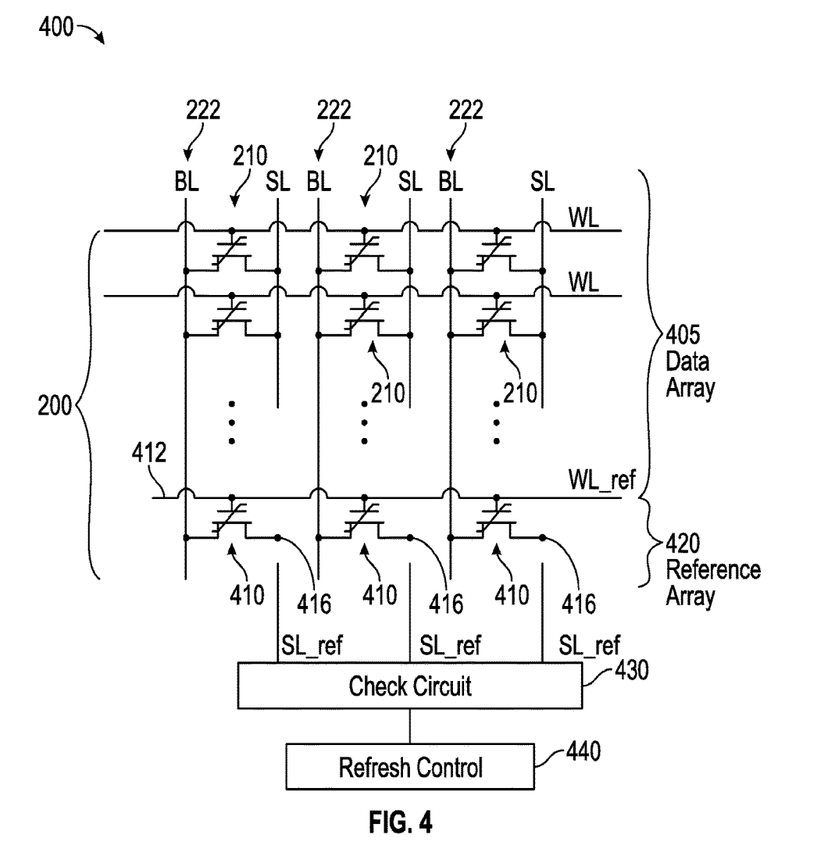
FIG. 4 is a diagram showing memory cell refresh circuitry that uses reference memory cells of a FeFET-based memory cell array in accordance with exemplary embodiments of the present disclosure.

FIG. 4 is a diagram showing memory cell refresh circuitry 400 that uses refresh reference/dummy memory cells 410 of a FeFET-based memory cell array 200 in accordance with exemplary embodiments. As shown by the FeDRAM example in FIG. 4, the array 200 can include a data array 405 that includes data cells 210 and a reference array 420 that includes the refresh reference cells 410. The refresh reference cells 410 are inactive cells in spare rows in the memory array 200, which can be arranged/implemented to have worse data retention capabilities than the data cells 210 in the same columns. The worse data retention capabilities can be achieved by, for example, applying P/E voltages of smaller magnitudes on a WL 412 (WL_ref) of refresh reference cells 410, refreshing the refresh reference cells 410 before the corresponding data cells 210 in each column, adjusting physical parameters (e.g., the cell area), or inducing laterally partial switching by applying asymmetric BL/SL voltages, and the like. As shown in FIG. 4, the refresh reference cells 410 can share the bitlines 222 of the data cells 210, while a sourceline 416 for each column of the refresh reference cells 410 can be separate/different from the sourcelines 224 of the data cells 210, and can be controlled by a check unit 430 which, in some embodiments, can correspond to a logical function of the refresh circuitry and/or can be implemented as independent circuitry. Likewise, the wordline(s) 412 for each column of the refresh reference cells 410 can be separate/different from the wordlines 232 of the data cells 210.

The state of the refresh reference cells 410 can be examined (e.g., the state of polarization can be examined directly or indirectly) by a check unit 430. If the threshold of data degradation is reached in the refresh reference cells 410 (e.g., if a shift of the voltage of the refresh reference cells, which may be indicative of a change in the polarization of the ferroelectric material, exceeds a threshold voltage value), a refresh-enable signal can be generated by refresh control circuitry 440 and the corresponding column(s) of data cells 210 associated with the column(s) of reference cells that exceed the threshold can be refreshed. For the refresh operation, various schemes, such as that practiced in the conventional DRAM, or disturb-centric scheme, and/or the reference FET scheme, can be used independently or in combination as coordinated by the refresh control circuitry 440.

Figure 5:
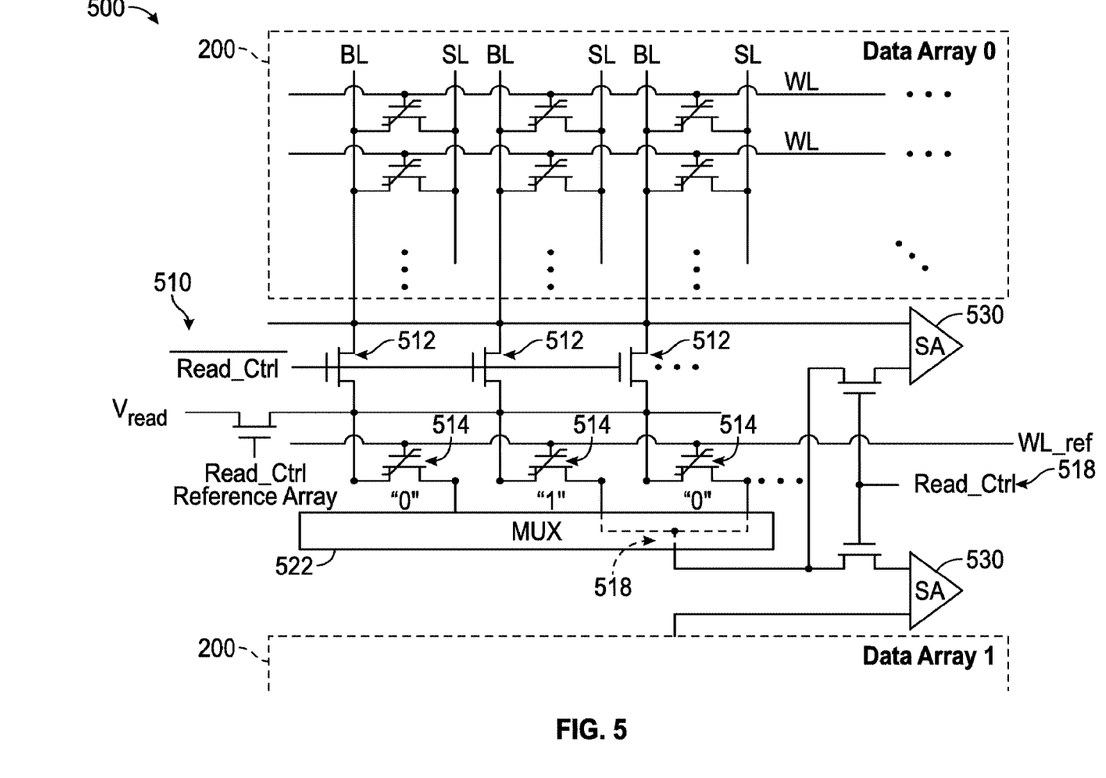
FIG. 5 is a diagram showing read circuitry for a FeFET-based memory cell array in accordance with exemplary embodiments of the present disclosure.

FIG. 5 is a diagram showing read circuitry 510 for FeFET-based memory cell arrays 200 of a FeDRAM device 500 in accordance with exemplary embodiments. The read circuitry 510 can include read control switches 512 for reading charge or voltages stored on selected cells 210 in columns of the arrays 200. Exemplary embodiments of the read circuitry 510 can also include sensing reference cells 514 that can be included in the reference array 410 of FIG. 4, a multiplexer 522, and comparators or sense amplifiers 530. A drain of the sensing reference cells 514 can be operatively coupled to the bitlines of the arrays 200, and a source of the sensing reference cells 514 can be operatively coupled to the multiplexer 522, which can be configured to operatively couple the sources of the sensing reference cells 514 based on a selector input received by the multiplexer 522. In some embodiments, reading data from a transistor-based memory cells 210 can be achieved by comparing the drain current of a selected FET-based cell 210 to a drain current of a corresponding one of the reference cell 514 having a $V_{th}$ set at the separation range between the ranges of logic 1 and logic 0. The comparators or sense amplifiers 530 can carry-out the comparison and output the read result (e.g., power line voltage $V_{dd}$ corresponds to a logic 1 and ground potential corresponds to a logic zero).

In exemplary embodiments, at least some the refresh reference FeFET cells 410 (FIG. 4) can be used as the sensing reference cells 514 (FIG. 5). To be representative for the retention of memory, the sensing reference cells are programmed to "1" in odd column and "0" in even column. To provide a sensing current $I_{ref}$ that corresponds to an electrical current that is greater than the expected drain current for a logic "0" and is less than the expected drain current for a logic "1" ($I_1 > I_{ref} > I_0$) using the same reference cells, the read control circuitry 510 can randomly select two adjacent columns and use their average current as the $I_{ref}$, as shown in FIG. 5 (e.g., the multiplexer provides a connection 518 to connect the sources of the cells 514 as shown in FIG. 5). The sum electrical current from two adjacent reference cells, which stores "1" and "0" respectively, is averaged by sharing one reference cell array 514 with two (active) data arrays 200 as shown in FIG. 5.

Figure 6:
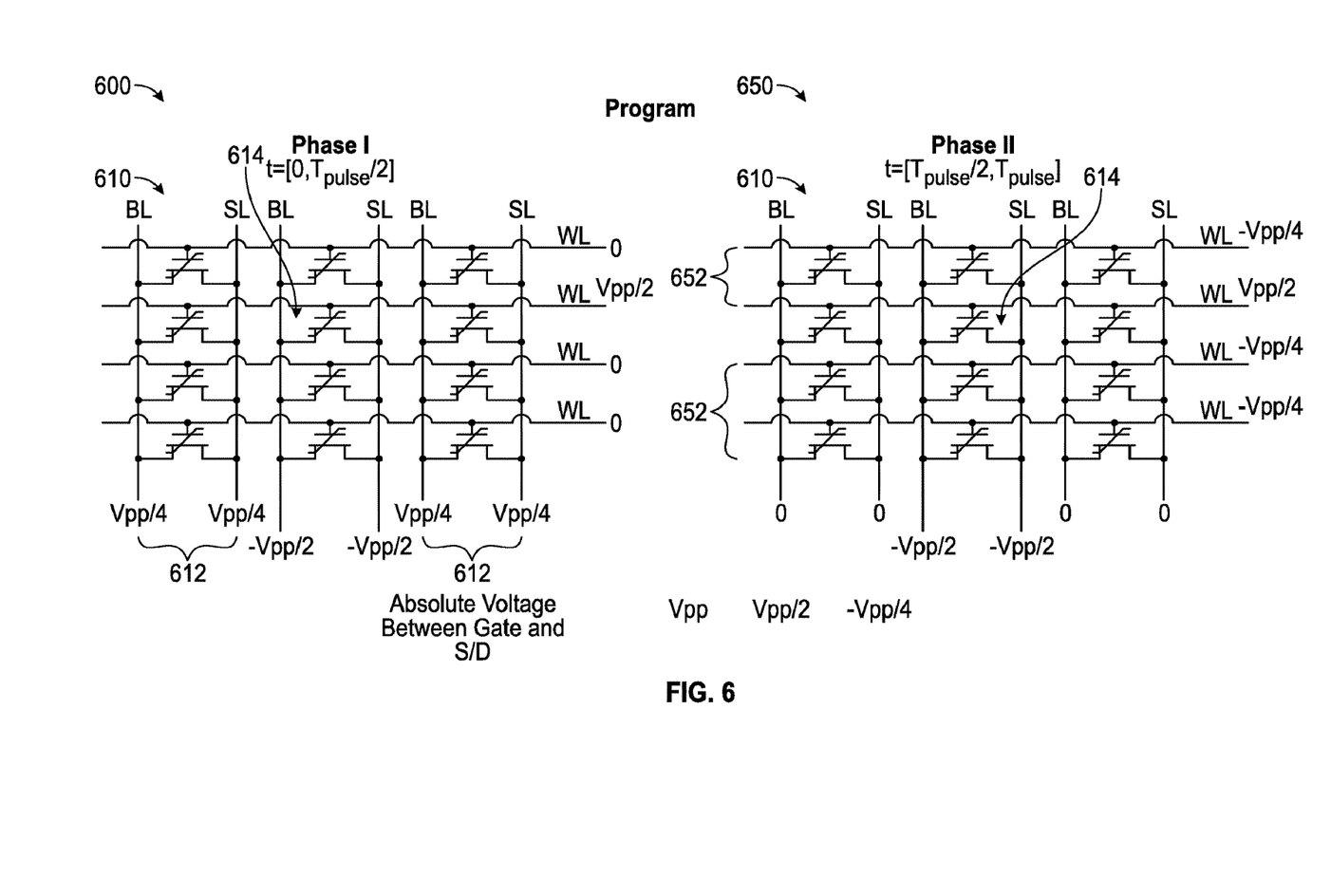
FIG. 6 illustrates an operation of a FeFET-based memory cell array for managing an effect of a program cycle on unselected memory cells in the FeFET-based memory cell array in accordance with exemplary embodiments of the present disclosure.

FIG. 6 illustrates an operation of a FeFET-based memory cell array 610 for managing an effect of a program or erase cycles on unselected memory cells in the FeFET-based memory cell array in accordance with exemplary embodiments. During a programming/erasing cycle, a program or erase voltage ($+/-V_{pp}$) is formed between the gate (as controlled by the WL) and source/drain (as controlled by the BL and SL) of a selected FeFET cell. In some embodiments, during programming, the WL is set to ($V_{pp}/2$) and the BL and SL are set to ($-V_{pp}/2$), and during erasing, the WL is set to ($-V_{pp}/2$) and the BL and SL are set to ($V_{pp}/2$). For unselected cells sharing the same WL or BL and SL with the selected cell, the WL and BL & SL can be held at ground potential for disturb control, yielding a $V_{pp}/2$ between the gate and S/D of the unselected cells. Since ferroelectric films usually do not have a very steep electric field threshold for polarization switching, even a $V_{pp}/2$ can cause non-negligible disturb to the polarization of unselected cells.

To further reduce disturbance to the polarization of unselected cells, instead of Vpp/2 or a Vpp/3 scheme, exemplary embodiments of the present disclosure provide for optimizing the pulse voltage and adjusting a pulse width of WL, SL, and BL control signals to reduce the program/erase (P/E) disturb experienced by unselected cells sharing the same row or column with the selected cell. For example, as shown in FIG. 6, in a first half of the programming pulse (Phase I 600), a voltage Vpp/4 is applied on the BL and SL of all the unselected cells 612 in the columns adjacent to the column of the selected cell 614, and then, in the second half of the programming pulse (Phase II 650), as shown in FIG. 6, a voltage –Vpp/4 is applied on the WL of all the unselected cells 652 in the rows adjacent to the row of the selected cell 614. Using this approach, the time period during which unselected cells suffering a disturb voltage with the magnitude of Vpp/2 can be reduced by half. The effect of a disturb voltage of Vpp/4 is substantially negligible for a FeFET cell, as this value is usually close to the read voltage. The above-described scheme can also be applied for the erase operation with a reversed voltage polarity. For example, a voltage –Vpp/4 is applied on the bitlines and the sourcelines associated with unselected cells during a first half of the erasing pulse (Phase I), and a voltage ±Vpp/4 is applied on the WL of all the unselected cells is applied to the during a second half of the erasing pulse (Phase II).

Figure 7A:
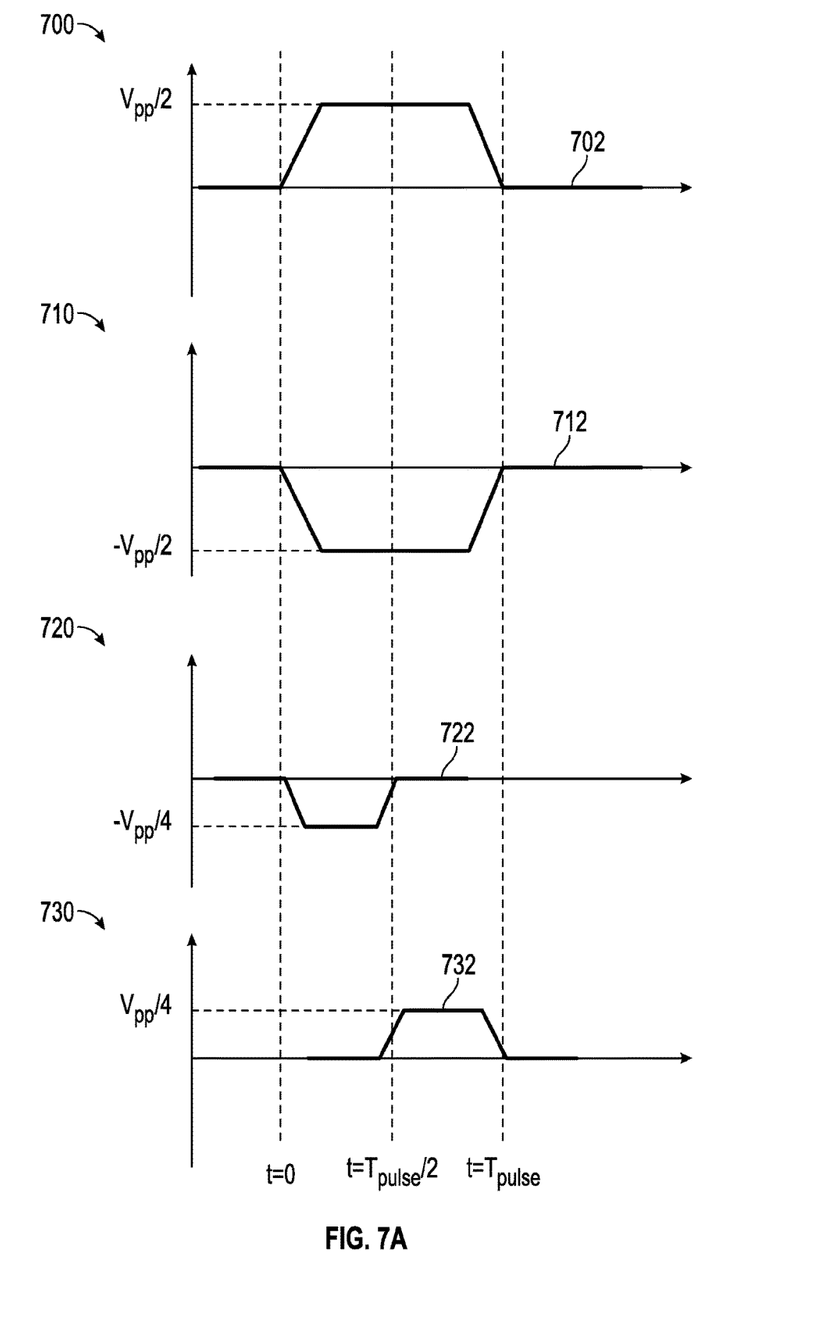
FIG. 7A shows example timing diagrams corresponding to voltages on wordlines, bitlines and sourcelines within a programming pulse described with reference to the FeFET-based memory cell array 610 shown in FIG. 6.
Figure 7B:
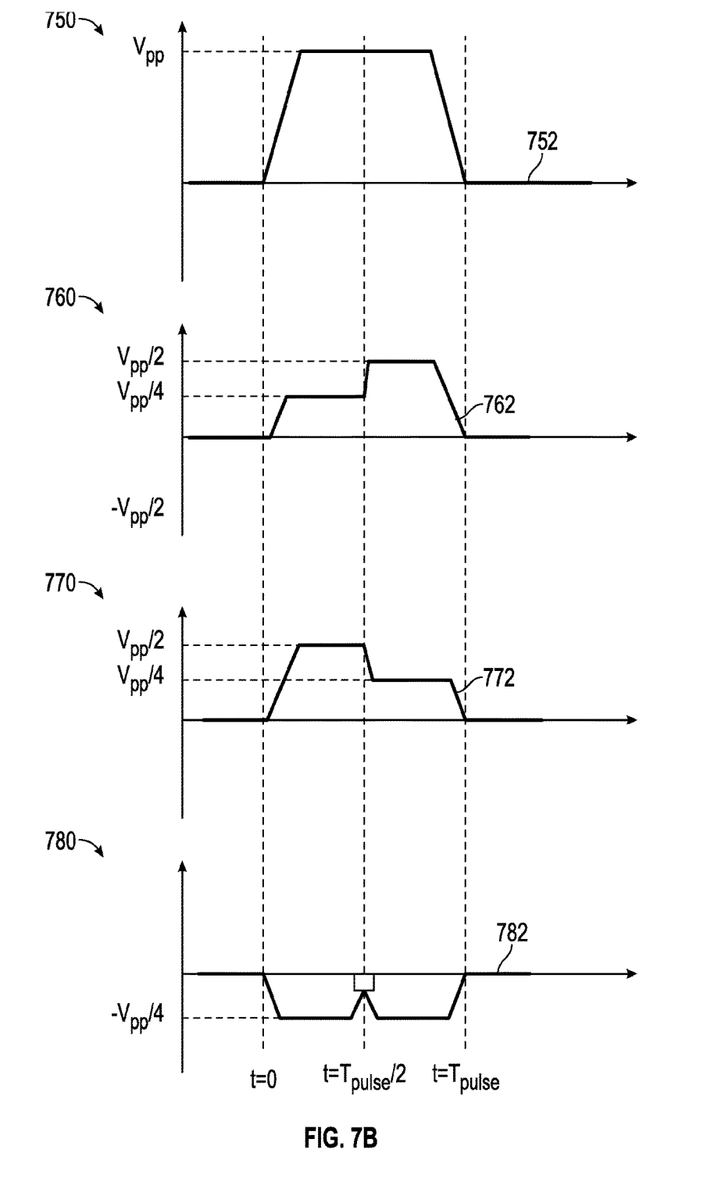
FIG. 7B shows example timing diagrams corresponding to voltage differences across the ferroelectric gate stacks of selected and unselected cells in response to the voltages shown in FIG. 7A.

FIG. 7A shows example timing diagrams corresponding to voltages on wordlines, bitlines and sourcelines within a programming pulse described with reference to the FeFET-based memory cell array 610 shown in FIG. 6. FIG. 7B shows example timing diagrams corresponding to voltage differences across the ferroelectric gate stacks of selected and unselected cells in response to the voltages shown in FIG. 7A. The timing diagrams show voltages as a function of time, t, where the x-axes of the timing diagrams correspond to time, t, and the y-axes of the timing diagrams correspond to volts.

Referring to FIG. 7A, timing diagram 700 shows a voltage pulse 702 as a function of time, t, and timing diagram 710 shows a voltage pulse 712 on the bitline and source line of the selected FeFET-based memory cell as a function of time, t. The voltage pulses 702 and 712 can begin at a time, t=0, and end at a time, t=T, and can be used, for programming a selected FeFET-based memory cell (e.g., polarizing the ferroelectric material of the gate of the selected FeFET-based memory cell). The voltage pulse 702 can have an amplitude of $V_{pp}/2$ and the voltage pulse can have an amplitude of $-V_{pp}/2$, such that the difference between the voltage pulses 702 and 712 results in a voltage pulse 752 of $V_{pp}$ across the ferroelectric gate stack of selected FeFET-based memory cell as shown in timing diagram 750 of FIG. 7B.

To minimize the disturbance of the polarizations of unselected FeFET-based memory cells, voltages are also applied to the wordlines, bitlines, and sourcelines of the unselected FeFET-based memory cells. For example, with reference to FIG. 7A, timing diagram 720 shows a voltage pulse 722 applied to the wordlines of unselected FeFET-based memory cells, and timing diagram 730 shows a voltage pulse 732 applied to the bitlines and sourcelines of the unselected FeFET-based memory cells, where the voltage pulses 722 and 732 are applied during the programming cycle defined by the voltage pulses 702 and 712. As shown in the timing diagram 720, the voltage pulse 722 on the wordlines has an amplitude of $-V_{pp}/4$, which begins at time t=0 and ends at time t=T/2 such that the voltage pulse 722 generally occurs during the first half of the programming cycle. As shown in the timing diagram 730, the voltage pulse 732 on the bitlines and the sourcelines have an amplitude of $V_{pp}/4$, which begins at time t=T/2 and ends at time t=T such that the voltage pulse 732 generally occurs during the second half of the programming cycle.

Timing diagram 760, shown FIG. 7B, illustrates a voltage pulse 762 across the ferroelectric gate stack of unselected FeFET-based memory cell sharing a bitline with the selected FeFET-based memory cell. The voltage pule 762 results from the voltage pulse 702 and the voltage pulse 722 shown in FIG. 7A. The voltage of $-V_{pp}/4$ applied to the wordlines of the unselected cells during the first half of the pulse results in the voltage difference across the ferroelectric gate stack of unselected FeFET-based memory cells sharing a bitline with the selected FeFET-based memory cell to be Vpp/4 during the first half of the programming cycle and Vpp/2 during the second half of the programming cycle.

Timing diagram 770, shown FIG. 7B, illustrates a voltage pulse 772 across the ferroelectric gate stack of unselected FeFET-based memory cell sharing a wordline with the selected FeFET-based memory cell. The voltage pule 772 results from the voltage pulse 712 and the voltage pulse 732 shown in FIG. 7A. The voltage of $V_{pp}/4$ applied to the bitlines and sourcelines of the unselected FeFET-based memory cells during the second half of the pulse results in the voltage difference across the ferroelectric gate stack of unselected FeFET-based memory cells sharing the wordline with the selected FeFET-based memory cell to be Vpp/4 during the second half of the programming cycle and Vpp/2 during the first half of the programming cycle.

Timing diagram 780, shown FIG. 7B, illustrates a voltage pulse 782 across the ferroelectric gate stack of unselected FeFET-based memory cell sharing no lines with the selected FeFET-based memory cell. The voltage pule 782 results from the voltage pulse 722 and the voltage pulse 732 shown in FIG. 7A. The voltage of $-V_{pp}/4$ applied to the wordlines of the unselected FeFET-based memory cells during the first half of the pulse results in the voltage difference across the ferroelectric gate stack of unselected FeFET-based memory cells sharing no lines with the selected FeFET-based memory cell to be $-V_{pp}/4$ during the first half of the programming cycle. The voltage of $V_{pp}/4$ applied to the bitlines and sourcelines of the unselected FeFET-based memory cells during the second half of the pulse results in the voltage difference across the ferroelectric gate stack of unselected FeFET-based memory cells sharing no lines with the selected FeFET-based memory cell to be $-V_{pp}/4$ during the second half of the programming cycle.

The foregoing description of the specific embodiments of the subject matter disclosed herein has been presented for purposes of illustration and description and is not intended to limit the scope of the subject matter set forth herein. It is fully contemplated that other various embodiments, modifications and applications will become apparent to those of ordinary skill in the art from the foregoing description and accompanying drawings. Thus, such other embodiments, modifications, and applications are intended to fall within the scope of the following appended claims. Further, those of ordinary skill in the art will appreciate that the embodiments, modifications, and applications that have been described herein are in the context of particular environment, and the subject matter set forth herein is not limited thereto, but can be beneficially applied in any number of other manners, environments and purposes. Accordingly, the claims set forth below should be construed in view of the full breadth and spirit of the novel features and techniques as disclosed herein.

What is claimed is:

1. A memory circuit comprising:
    FeFET-based data memory cells arranged in an array having rows and columns, the FeFET-based memory cells capable of being polarized to set memory values of the FeFET-based memory cells to a logic one or a logic zero;
    wordlines, each of the wordlines operatively coupled to one of the rows of FeFET-based data memory cells;
    bitlines, each of the bitlines operatively coupled to the columns of FeFET-based data memory cells; and
    sourcelines, each of the sourcelines operatively coupled to the columns of FeFET-based data memory cells, each of the FeFET-based data memory cells in each column shares one of the bitlines and one of the source lines,
    wherein a selected one of the FeFET-based memory cells is programmed during a programming cycle by setting a corresponding selected one of the wordlines, a corresponding selected one of the bitlines, and a corresponding selected one of the sourcelines to generate a first voltage difference across a ferroelectric gate stack of the selected one of the FeFET-based memory cells throughout the programming cycle; and
    wherein a second voltage difference across a ferroelectric gate stack of a first unselected one of the FeFET-based memory cells that shares the corresponding selected one of the bitlines and the corresponding selected one of the sourcelines with the selected one of the FeFET-based memory cells is varied as a function of time to be a first fraction of the first voltage difference during a portion of the programming cycle and to be a second fraction of the first voltage difference during another portion of the programming cycle to control disturbances to a polarization of the first unselected one of the FeFET-based memory cells by applying a first control voltage pulse to a corresponding unselected one of the wordlines of the first unselected one of the FeFET-based memory cells during the portion of the programming cycle.

2. The memory circuit of claim 1, wherein the portion of the programming cycle corresponds to half of the programming cycle.

3. The memory circuit of claim 2, wherein the other portion of the programming cycle corresponds to another half of the programming cycle.

4. The memory circuit of claim 1, wherein a third voltage difference across a ferroelectric gate stack of a second unselected one of the FeFET-based memory cells that shares the corresponding selected one of the wordlines with the selected one of the FeFET-based memory cells is varied as a function of time to be the second fraction of the first voltage difference during the portion of the programming cycle and to be the first fraction of the first voltage difference during the other portion of the programming cycle to control disturbances to the polarization of the second unselected one of the FeFET-based memory cells by applying a second control voltage pulse to a corresponding unselected one of the bitlines and to a corresponding unselected one of the sourcelines of the second unselected one of the FeFET-based memory cells during the portion of the programming cycle, and
    wherein the first control voltage pulse and the second control voltage pulse have substantially equal magnitudes and opposite polarities.

5. The memory circuit of claim 1, further comprising:
    refresh circuitry operatively coupled to the FeFET-based data memory cells, the refresh circuitry being configured to refresh the FeFET-based data memory cells in response to satisfaction of a refresh threshold.

6. The memory circuit of claim 5, wherein the refresh threshold is adjustable over a lifespan of the FeFET-based data memory cells to accommodate for deterioration of the FeFET-based data memory cells.

7. The memory circuit of claim 6, wherein the refresh threshold is adjusted according to a pre-determined schedule.

8. The memory circuit of claim 6, wherein the memory array includes reference FeFET-based memory cells and the refresh threshold is adjusted according to a use of the reference FeFET-based memory cells.

9. The memory circuit of claim 5, wherein (i) gates of the FeFET-based memory cells in each row of the memory array are operatively coupled to one of the wordlines, (ii) drains of the FeFET-based memory cells in each column of the memory array are operatively coupled to one of the bitlines, (iii) sources of the FeFET-based memory cells in each column of the memory array are operatively coupled to one of the sourcelines, and the refresh circuitry further comprises:

voltage sensors, wherein each of the wordlines, bitlines, and sourcelines are operatively coupled to one of the voltage sensors;

counter circuits, wherein each of the voltage sensors are operatively coupled to one of the counter circuits, the counter circuits being configured to monitor a number of times the bitlines, the sourcelines, and the wordlines are selected; and     refresh control circuitry operatively coupled to the counter circuits, the refresh control circuitry being configured to determine whether the refresh threshold is satisfied based on the number of times the bitlines, the sourcelines, and the wordlines are selected and to refresh at least one of the data memory cells in the memory array in response to determining the number of times the bitlines, the sourcelines, and the wordlines are selected satisfies the refresh threshold.

10. The memory circuit of claim 5, wherein the memory array further comprises reference memory cells, each of the reference memory cells being formed by a Ferroelectric Field Effect Transistor and the refresh circuitry further determines a state of the reference memory cells and initiates a refresh of the data memory cells based on a state of the reference memory cells.

11. The memory circuit of claim 5, wherein the memory array includes reference memory cells and the refresh threshold is adjusted according to a use of reference FeFET cells.

12. A method of controlling a degree to which polarization of unselected FeFET-based memory cells in a memory array are disturbed by an operation performed with respect to a selected FeFET-based memory cell, the method comprising:

programming the selected FeFET-based memory cell by generating a first voltage difference across a ferroelectric gate stack of the selected FeFET-based memory cell throughout a programming cycle via a corresponding selected wordline, a corresponding selected bitline, and a corresponding selected sourceline; and     generating a second voltage difference across a ferroelectric gate stack of a first unselected one of the FeFET-based memory cells that shares the corresponding selected bitline and the corresponding selected sourceline with the selected one of the FeFET-based memory cells to be a first fraction of the first voltage difference during a portion of the programming cycle and to be a second fraction of the first voltage difference during another portion of the programming cycle by applying a first control voltage pulse to a corresponding unselected wordline of the first unselected FeFET-based memory cell during a portion of a programming cycle; and     generating a third voltage difference across a ferroelectric gate stack of a second unselected FeFET-based memory cell that shares the corresponding selected wordline with the selected FeFET-based memory cell to be the second fraction of the first voltage difference during the portion of the programming cycle and to be the first fraction of the first voltage difference during the other portion of the programming cycle by applying a second control voltage pulse to a corresponding unselected bitline and to a corresponding unselected sourceline of the second unselected FeFET-based memory cell during the other portion of the programming cycle.

13. The method of claim 12, wherein the portion of the programming cycle corresponds to half of the programming cycle.

14. The method of claim 13, wherein the other portion of the programming cycle corresponds to another half of the programming cycle.

15. The method of claim 12, wherein the first control voltage pulse and the second control voltage pulse have substantially equal magnitudes and opposite polarities.

\* \* \* \* \*